(12) United States Patent
Su et al.

(10) Patent No.: US 7,047,757 B2
(45) Date of Patent: May 23, 2006

(54) VACUUM LASER CONSTANT TEMPERATURE DEVICE

(75) Inventors: Sheng-Pin Su, Chung Li (TW); Chun-Kun Yu, Tao Yuan (TW)

(73) Assignee: Eins OE-Tech Co., Ltd., Taoyuan (TW)

( * ) Notice: Subject to any disclaimer, the term of this patent is extended or adjusted under 35 U.S.C. 154(b) by 102 days.

(21) Appl. No.: 10/846,501

(22) Filed: May 17, 2004

(65) Prior Publication Data

US 2005/0252228 A1    Nov. 17, 2005

(51) Int. Cl.
*F25D 23/12* (2006.01)
*F25B 21/02* (2006.01)
*H01S 3/04* (2006.01)

(52) U.S. Cl. .......................... 62/259.2; 62/3.2; 372/34
(58) Field of Classification Search ................. 62/3.2, 62/259.2; 372/34, 36; 398/135
See application file for complete search history.

(56) References Cited

U.S. PATENT DOCUMENTS

| | | | | |
|---|---|---|---|---|
| 6,712,928 B1 * | 3/2004 | Nakano et al. | ........ | 156/345.24 |
| 6,765,935 B1 * | 7/2004 | Kimura et al. | ........... | 372/29.02 |
| 6,821,030 B1 * | 11/2004 | Fukuda et al. | ................ | 385/92 |
| 2005/0180754 A1 * | 8/2005 | Mizue et al. | ............... | 398/135 |

* cited by examiner

*Primary Examiner*—Marc Norman
(74) *Attorney, Agent, or Firm*—Troxell Law Office, PLLC

(57) ABSTRACT

A vacuum laser constant temperature device is adopted for a housing that has a heat dissipation module arranged therein. The device has a metallic partition adjacent to the heat dissipation module to enclose a airtight vacancy formed with the housing, a thermoelectric cooling chip with a heating portion connecting to a side of the metallic partition and a cooling portion, a semiconductor laser lighting module arranged in the airtight vacancy and connecting to the cooling portion of the thermoelectric cooling chip, and a heat insulation layer arranged both on an opposite side of the metallic partition and in the airtight vacancy. Heat generated by the semiconductor laser lighting module can be transferred to the heat dissipation module via the thermoelectric cooling chip and the metallic partition. The thermoelectric cooling chip makes an output power of the semiconductor laser lighting module keep constant within various environments without the condensation thereon.

9 Claims, 6 Drawing Sheets

VACUUM LASER CONSTANT TEMPERATURE DEVICE

BACKGROUND OF THE INVENTION

1. Field of the Invention

The present invention relates to a vacuum laser constant temperature device, and particularly relates to a vacuum laser constant temperature device making an output power of a semiconductor laser lighting module constant in various environments.

2. Background of the Invention

Referring to FIG. 1, a first conventional high power semiconductor laser lighting device adopted for industrial instruments includes a housing 60, a resilient mount 65, a high power laser module 70, a controlling mask 75, at least one fan 80 and a voltage regulator circuit unit 85. The resilient mount 65 is disposed in a bottom of the housing 60, and has an insulating post 66 arranged in a front portion thereof and an insulating spring 67 arranged in a rear portion thereof. The high power laser module 70 includes a heat dissipation ring 71 disposed on a top of the resilient mount 65. The controlling mask 75 is located an inner front wall of the housing 60. The fan 80 is arranged on an inner bottom surface of the housing 60. The fan 80 can be arranged in a heat dissipation hole formed on a rear wall of the housing 60 or the fan 80 can be arranged on a frame 63 to carry heat out of a heat dissipation hole 64 formed in each lateral wall of the housing 60. The voltage regulator circuit unit 85 is arranged on the inner bottom surface of the housing 60, whereby the voltage regulator circuit unit 85 switches between alternating currents and direct currents to stabilize the direct currents of the high power laser module 70 and the fan 80.

The high power laser module 70 dissipates heat only by the heat dissipation ring 71, and the fan 80 is arranged restrictively by space due to the volume, so as to fail to provide better heat dissipating efficiency.

Therefore, a second conventional high power semiconductor laser module is referred to provide better heat dissipation efficiency and high stability thereof. With respect to FIGS. 2 and 3, the second conventional high power semiconductor laser module includes a semiconductor heat dissipation module 10, a power controller 20 and a transmission media 30. The transmission media 30 connects the semiconductor heat dissipation module 10 to the power controller 20 for transferring power from the power controller 20 to the semiconductor heat dissipation module 10. The semiconductor heat dissipation module 40 includes a semiconductor laser module 40, two metallic members 401 and two heat conduction plates 402 arranged on a periphery of the semiconductor heat dissipation module 40, and a thermoelectric cooling chip 403 and a heat dissipation plate 404 connecting to an exterior of a surface of each heat conduction plate 402. The power controller 20 includes a power-driving unit (not shown) to transform the input source into direct current for the semiconductor laser module 40 and the thermoelectric cooling chip 403.

Heat from the semiconductor laser module 40 can be transferred through each of the two metallic members 401, each of the two heat conduction plates 402, the thermoelectric cooling chip 403, and the heat dissipation plate 404. The second conventional high power semiconductor laser module provides better heat dissipation efficiency than the first one described.

However, the thermoelectric cooling chip 403 is easily damaged in moist environments due to mist condensing into water in the thermoelectric cooling chip 403 to reduce the heat dissipation efficiency of the second conventional high power semiconductor laser module. The semiconductor laser module 40 can be excited easily with various environments to exchange an output power thereof.

Hence, an improvement over the prior art is required to overcome the disadvantages thereof.

SUMMARY OF INVENTION

The primary object of the invention is therefore to specify a vacuum laser constant temperature device making an output power of a semiconductor laser lighting module keep constant in various environments.

The secondary object of the invention is therefore to specify a vacuum laser constant temperature device to protect a thermoelectric cooling chip from mist and prevent a decrease of the heat dissipation efficiency thereof.

According to the invention, these objects are achieved by a vacuum laser constant temperature device adopted for a housing that has a heat dissipation module arranged therein. The vacuum laser constant temperature device includes elements as follows. A metallic partition is located adjacent to the heat dissipation module to enclose a airtight vacancy formed with the housing. A thermoelectric cooling chip includes a heating portion connecting to a side of the metallic partition and a cooling portion. A semiconductor laser lighting module is arranged in the airtight vacancy and connects to the cooling portion of the thermoelectric cooling chip. A heat insulation layer is arranged both on an opposite side of the metallic partition and in the airtight vacancy.

The metallic partition has a plurality of screw holes arranged in a bottom thereof.

The vacuum laser constant temperature device further includes a metallic mounting plate connecting between the thermoelectric cooling chip and the semiconductor laser lighting module.

The metallic mounting plate includes a plurality of screw holes formed in two lateral sides thereof, respectively. A plurality of screws are thus capable of penetrating through a heat-proof mat to be secured in the guiding passageways of the metallic partition, respectively.

The semiconductor laser lighting module includes a plurality of screw holes formed therein. A plurality of screws thus connect the metallic mounting plate via the screw holes, respectively.

The vacuum laser constant temperature device includes a heat insulation layer made of heatproof foam materials.

The vacuum laser constant temperature device further includes a driving unit arranged therein and adjacent to the heat dissipation module and electrically connecting to the thermoelectric cooling chip.

The vacuum laser constant temperature device further includes a fan adjacent to the heat dissipation module and connecting to the housing.

To provide a further understanding of the invention, the following detailed description illustrates embodiments and examples of the invention. Examples of the more important features of the invention thus have been summarized rather broadly in order that the detailed description thereof that follows may be better understood, and in order that the contributions to the art may be appreciated. There are, of course, additional features of the invention that will be described hereinafter and which will form the subject of the claims appended hereto.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE EMBODIMENTS

Figure 1:
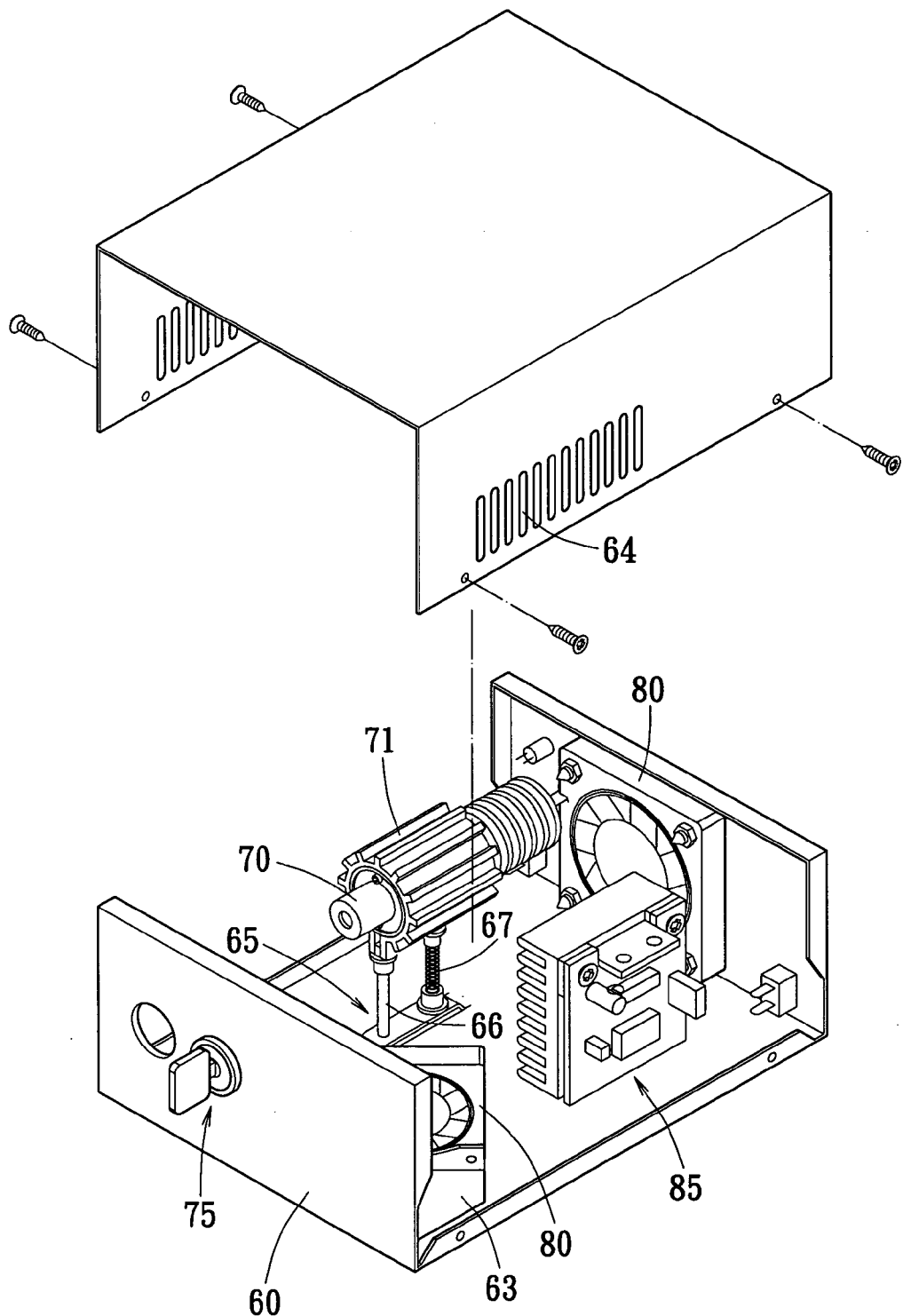
FIG. 1 is a perspective view of a first conventional high power semiconductor laser lighting device.
Figure 2:
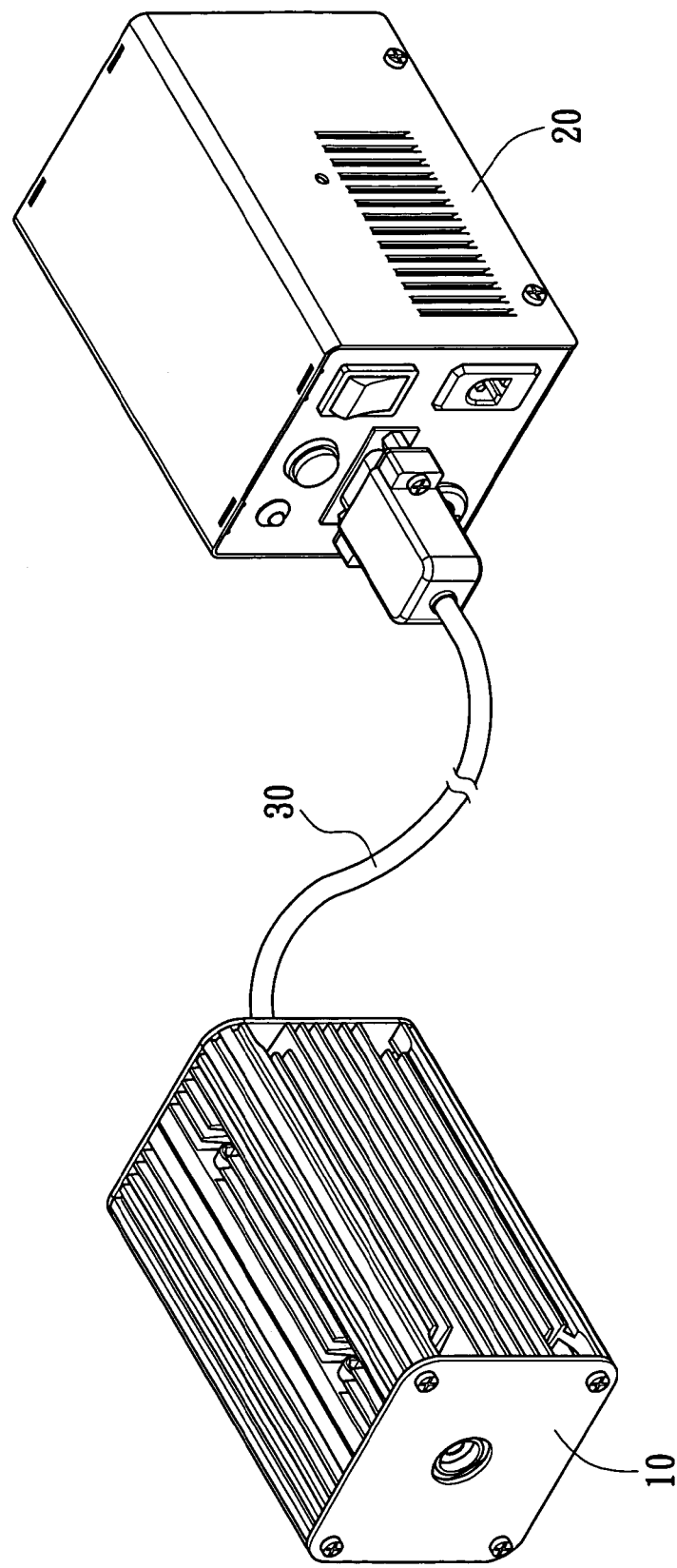
FIG. 2 is a perspective view of a second conventional high power semiconductor laser module.
Figure 3:
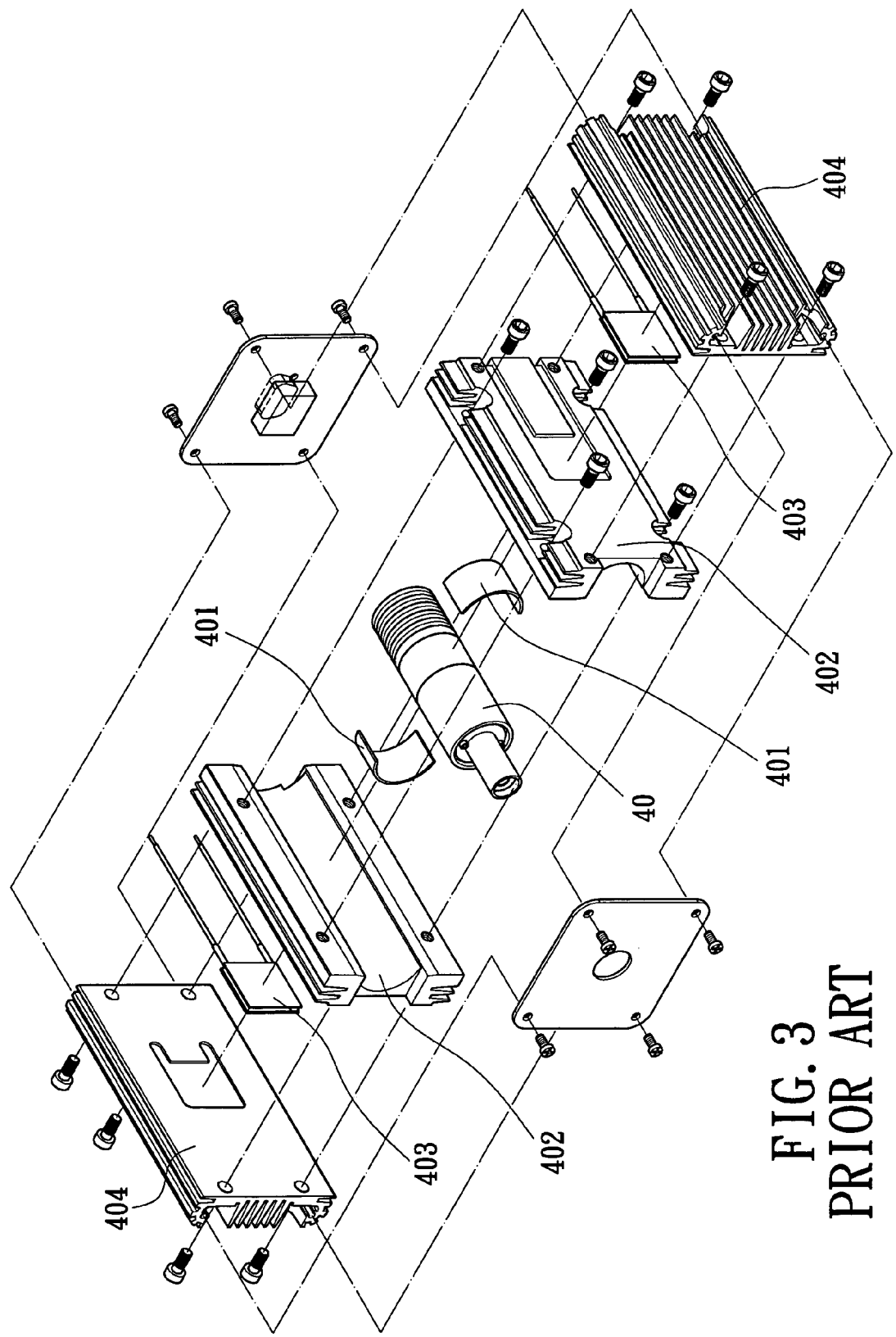
FIG. 3 is a decomposition view of the second conventional high power semiconductor laser module.
Figure 4:
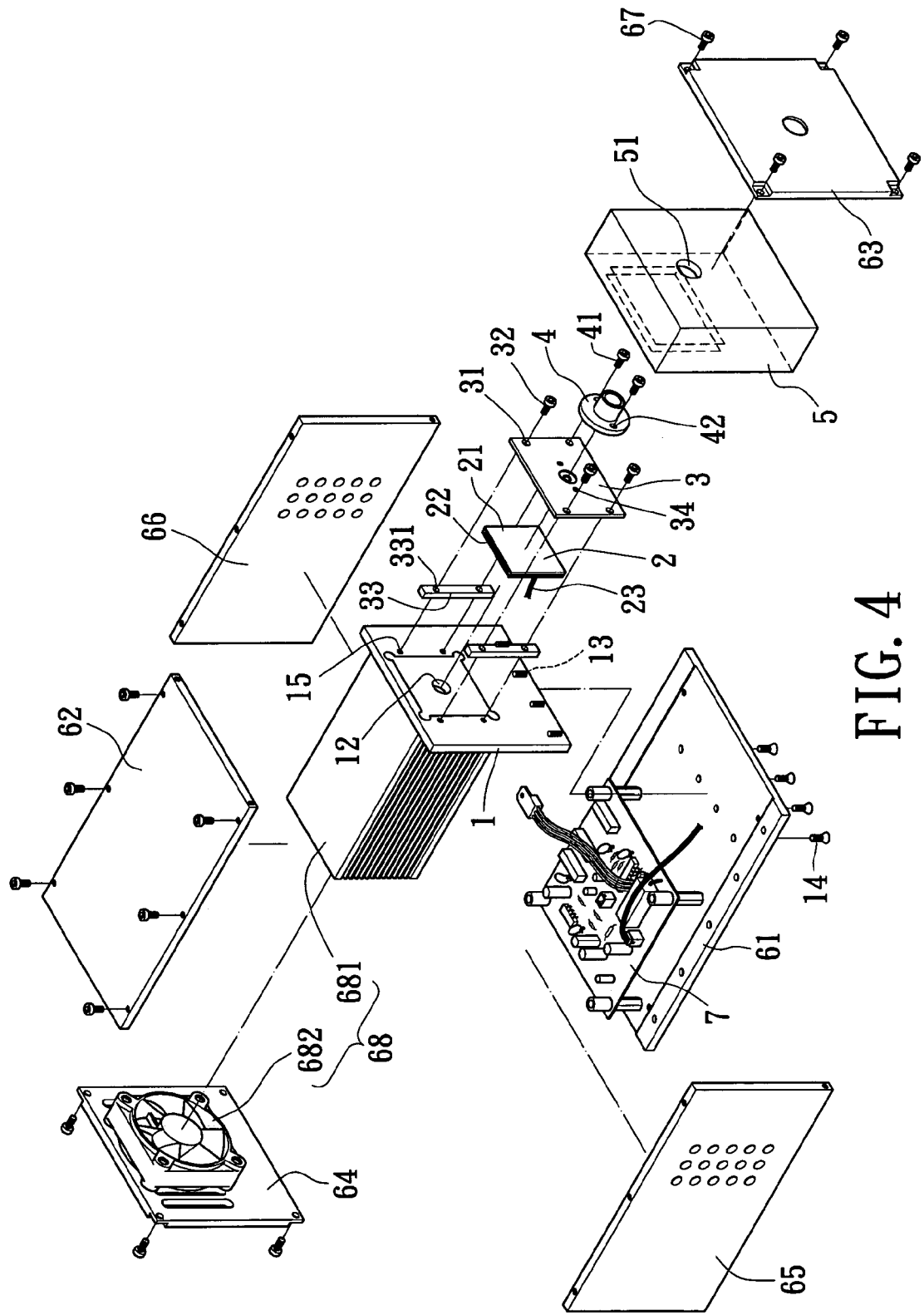
FIG. 4 is a decomposition view of a vacuum laser constant temperature device according to the present invention.
Figure 5:
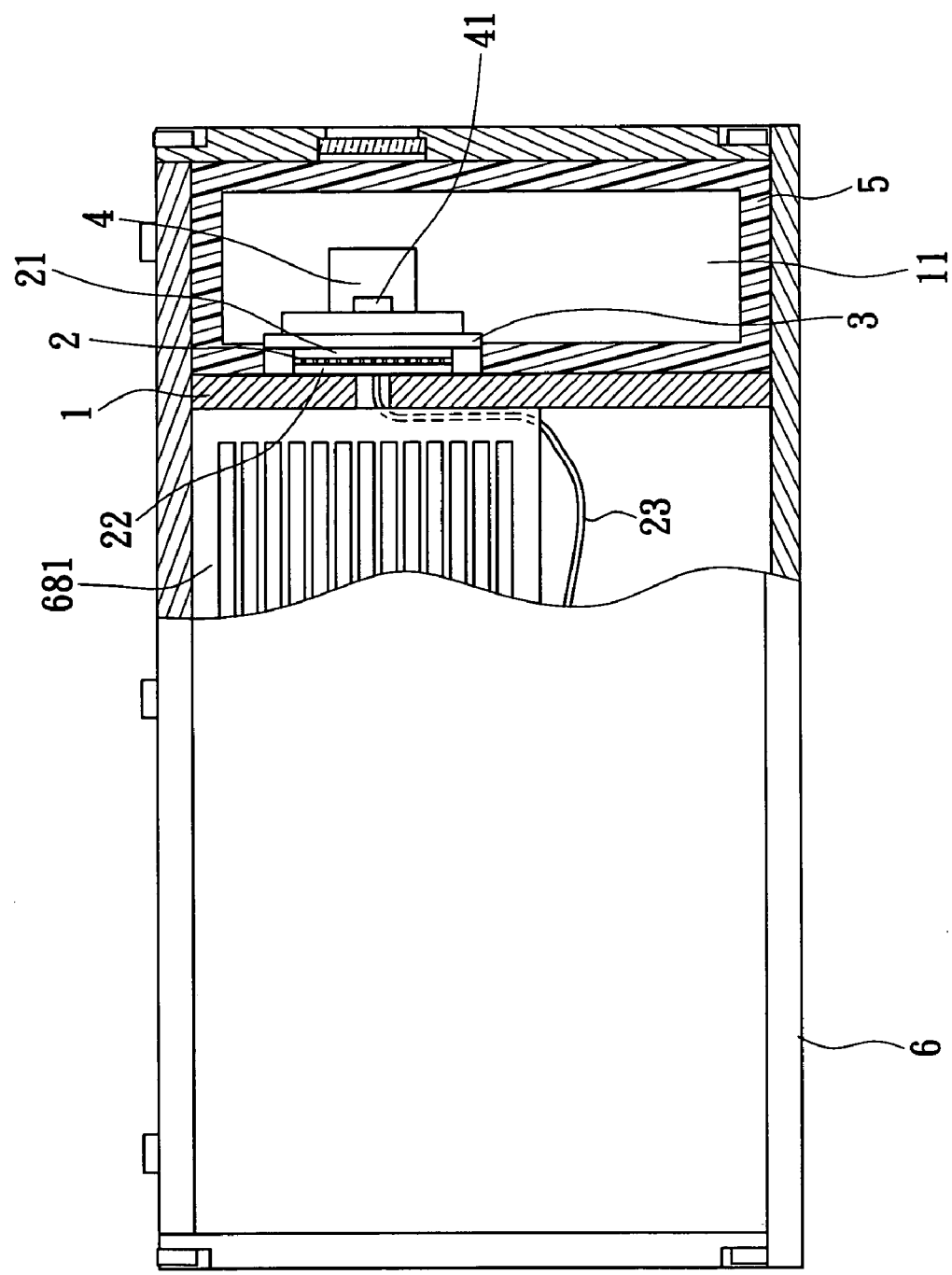
FIG. 5 is a perspective view of the vacuum laser constant temperature device according to the present invention.
Figure 6:
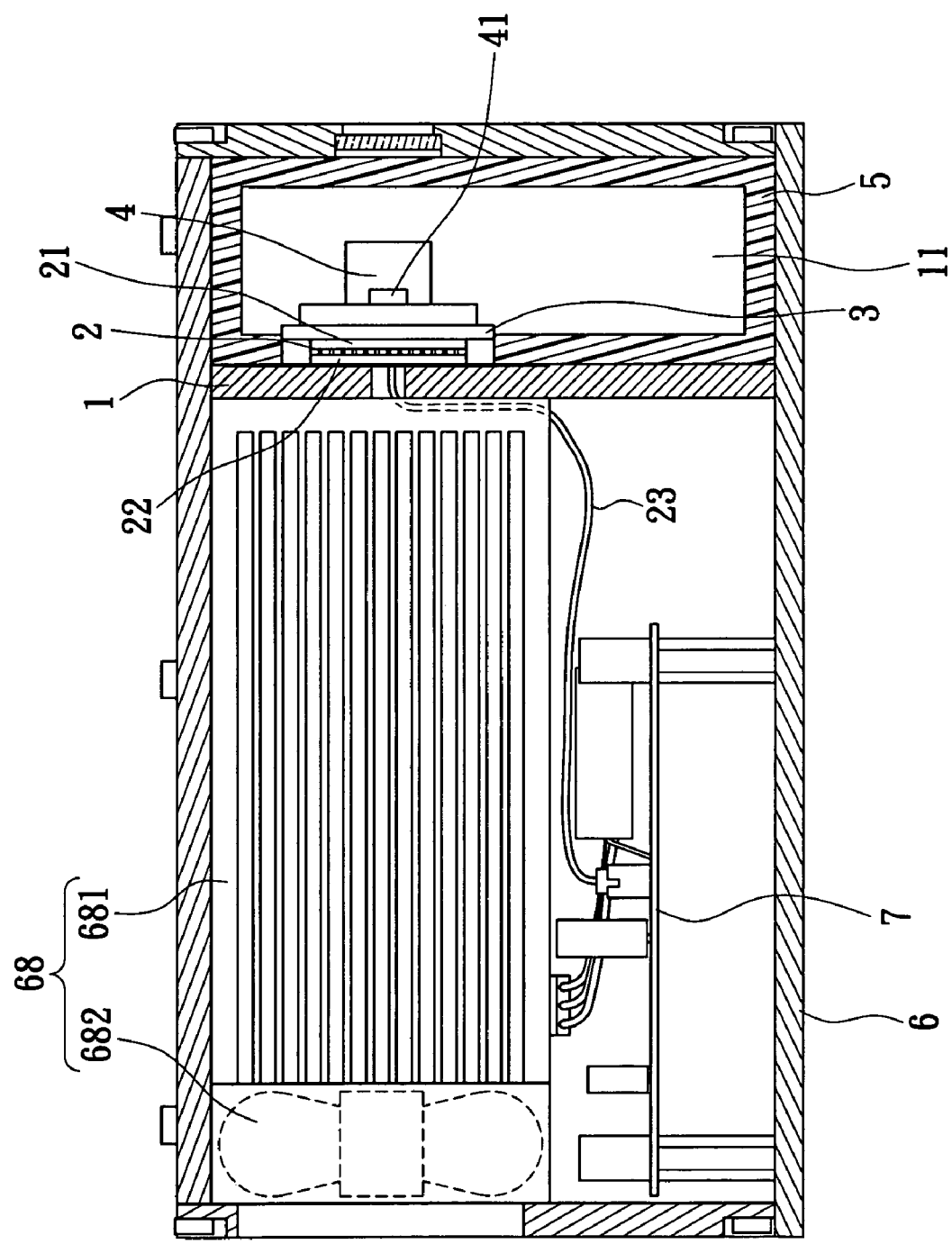
FIG. 6 is a perspective view of a preferred embodiment, with the vacuum laser constant temperature device adapted to for a high power semiconductor laser lighting device.

Illustrated in FIGS. 4 to 6, the present invention provides a vacuum laser constant temperature device adopted for a housing 6 and has a heat dissipation module 68 arranged therein. The housing 6 is a frame and includes a bottom wall 61, a top wall 62, a front wall 63, a rear wall 64 and two sidewalls 65, 66 connected via a plurality of screws 67. The heat dissipation module 68 includes a heat dissipation plate 681 and a fan 682 disposed thereon. The vacuum laser constant temperature device includes a metallic partition 1 adjacent to the heat dissipation module 68 to enclose a airtight vacancy 11 formed with the housing 6, a thermoelectric cooling chip 2 including a heating portion 22 connecting to a side of the metallic partition 1 and a cooling portion 21, a semiconductor laser lighting module 4 arranged in the airtight vacancy 11 and connecting to the cooling portion 21 of the thermoelectric cooling chip 2, a metallic mounting plate 3 connecting between the thermoelectric cooling chip 2 and the semiconductor laser lighting module 4, and a heat insulation layer 5 arranged both on an opposite side of the metallic partition 1 and in the airtight vacancy 11. Heat generated from the semiconductor laser lighting module 4 can be transferred to the heat dissipation module 68 via the thermoelectric cooling chip 2 and the metallic partition 1. The thermoelectric cooling chip 2 keeps an output power of the semiconductor laser lighting module 4 constant within various environments without the condensation thereon. The vacuum laser constant temperature device further includes a driving unit 7 arranged therein and adjacent to the heat dissipation module 68 and electrically connecting to the thermoelectric cooling chip 2.

The metallic partition 1 is a sheet. The airtight vacancy 11 is a vacuum and any vapor therein is completely evacuated. The metallic partition 1 has a hole 12 formed therein, a plurality of guiding passageways 15 adjacent to the hole 12, and a plurality of screw holes 13 arranged in a bottom thereof for a plurality of screws 14 to penetrate through the bottom wall 61 of the housing 6. The metallic partition 1 is connected to the housing 6 thereby.

The thermoelectric cooling chip 2 further includes a power code 23 penetrating through the hole 12 of the metallic partition 1 to connect the driving unit 7, which is arranged under the heat dissipation module 68. The driving unit 7 includes a circuit driving the semiconductor laser lighting module 4 and the thermoelectric cooling chip 2 and a temperature-controller feedback circuit to keep the semiconductor laser lighting module thermostatically.

The metallic mounting plate 3 includes a plurality of screw holes 31 formed on two lateral sides thereof, respectively. A plurality of screws 32 are thus capable of penetrating through a heat-proof mat 33 to be secured in the guiding passageways 15 of the metallic partition 1, respectively. The heat-proof mat 33 has two holes 331 formed therein and two screw holes respectively 34 adjacent to a center thereof.

The semiconductor laser lighting module 4 includes a plurality of screw holes 42 formed therein. A plurality of screws 41 thus connect the metallic mounting plate 3 via the screw holes 34, respectively.

The heat insulation layer 5 is glued to the opposite side of the metallic partition 1 and is made of heatproof foam materials. The heat insulation layer 5 has a lighting hole 51 for the light emission of the semiconductor laser lighting module 4.

When the semiconductor laser lighting module 4 is excited by the driving unit 7 to generate heat, the cooling portion 21 of the thermoelectric cooling chip 2 absorbs heat therefrom and the heating portion 22 thereof transfers the heat to the metallic partition 1 to be released from the heat dissipation module 68 and the housing 6.

The present invention are characterized by advantages as follow:

(1) The semiconductor laser lighting module 4 keeps a constant temperature to provide a constant power output thereof in various environments.

(2) The thermoelectric cooling chip 2 is protected from water condensation.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A vacuum laser constant temperature device adopted for a housing having a heat dissipation module arranged thereon, the vacuum laser constant temperature device comprising:
    a metallic partition adjacent to the heat dissipation module to enclose a airtight vacancy formed with the housing;
    a thermoelectric cooling chip including a heating portion connecting to a side of the metallic partition and a cooling portion;
    a semiconductor laser lighting module arranged in the airtight vacancy and connecting to the cooling portion of the thermoelectric cooling chip; and
    a heat insulation layer arranged both on an opposite side of the metallic partition and in the airtight vacancy.

2. The vacuum laser constant temperature device as claimed in claim 1, wherein the metallic partition has a hole formed therein and a plurality of guiding passageways adjacent to the hole.

3. The vacuum laser constant temperature device as claimed in claim 2, wherein the metallic partition has a plurality of screw holes located in a bottom thereof.

4. The vacuum laser constant temperature device as claimed in claim 1, further including a metallic mounting plate connected between the thermoelectric cooling chip and the semiconductor laser lighting module.

5. The vacuum laser constant temperature device as claimed in claim 4, wherein the metallic mounting plate includes a plurality of screw holes formed in two lateral sides thereof, respectively, whereby a plurality of screws penetrate through a heat-proof mat to be secured in the guiding passageways of the metallic partition, respectively.

6. The vacuum laser constant temperature device as claimed in claim 4, wherein the semiconductor laser lighting module includes a plurality of screw holes formed therein, whereby a plurality of screws connect the metallic mounting plate via the screw holes, respectively.

7. The vacuum laser constant temperature device as claimed in claim 1, wherein the heat insulation layer is made of heatproof foam materials.

8. The vacuum laser constant temperature device as claimed in claim 1, further including a driving unit arranged therein and adjacent to the heat dissipation module and electrically connecting to the thermoelectric cooling chip.

9. The vacuum laser constant temperature device as claimed in claim 1, further including a fan adjacent to the heat dissipation module and connecting to the housing.

* * * * *